United States Patent [19]

Darley et al.

[11] 4,201,997
[45] May 6, 1980

[54] MESFET SEMICONDUCTOR DEVICE AND METHOD OF MAKING

[75] Inventors: Henry M. Darley, Plano; Theodore W. Houston, Richardson, both of Tex.; James B. Kruger, Thousand Oaks, Calif.

[73] Assignee: Texas Instruments Incorporated, Dallas, Tex.

[21] Appl. No.: 898,582

[22] Filed: Apr. 21, 1978

[51] Int. Cl.² .......................................... H01L 29/48
[52] U.S. Cl. ...................................... 357/15; 357/22; 357/41; 357/49; 357/50
[58] Field of Search .................. 357/15, 41, 49, 50, 357/23, 22

[56] References Cited

U.S. PATENT DOCUMENTS 4,104,672  8/1978  DiLorenzo et al. ................ 357/15
4,139,786  2/1979  Raymond et al. ................. 357/41

Primary Examiner—Edward J. Wojciechowicz
Attorney, Agent, or Firm—Ronald A. Williamson; William E. Hiller; Richard L. Donaldson

[57] ABSTRACT

An improved MESFET integrated circuit device with a metal-semiconductor diode as the control element and a source and drain as other device elements is fabricated using a self-aligned gate process which consists of an implanted channel stopper underneath a thick field oxide, depletion and enhancement mode device channel implants, implanted source and drain regions, selective oxidation to form self-aligned gates, metal-semiconductor junctions as control elements, barrier metal and a thin film metallization system. The process and device structure are suited for high packing density, very low speed power product and ease of fabrication making it attractive for digital applications.

6 Claims, 18 Drawing Figures

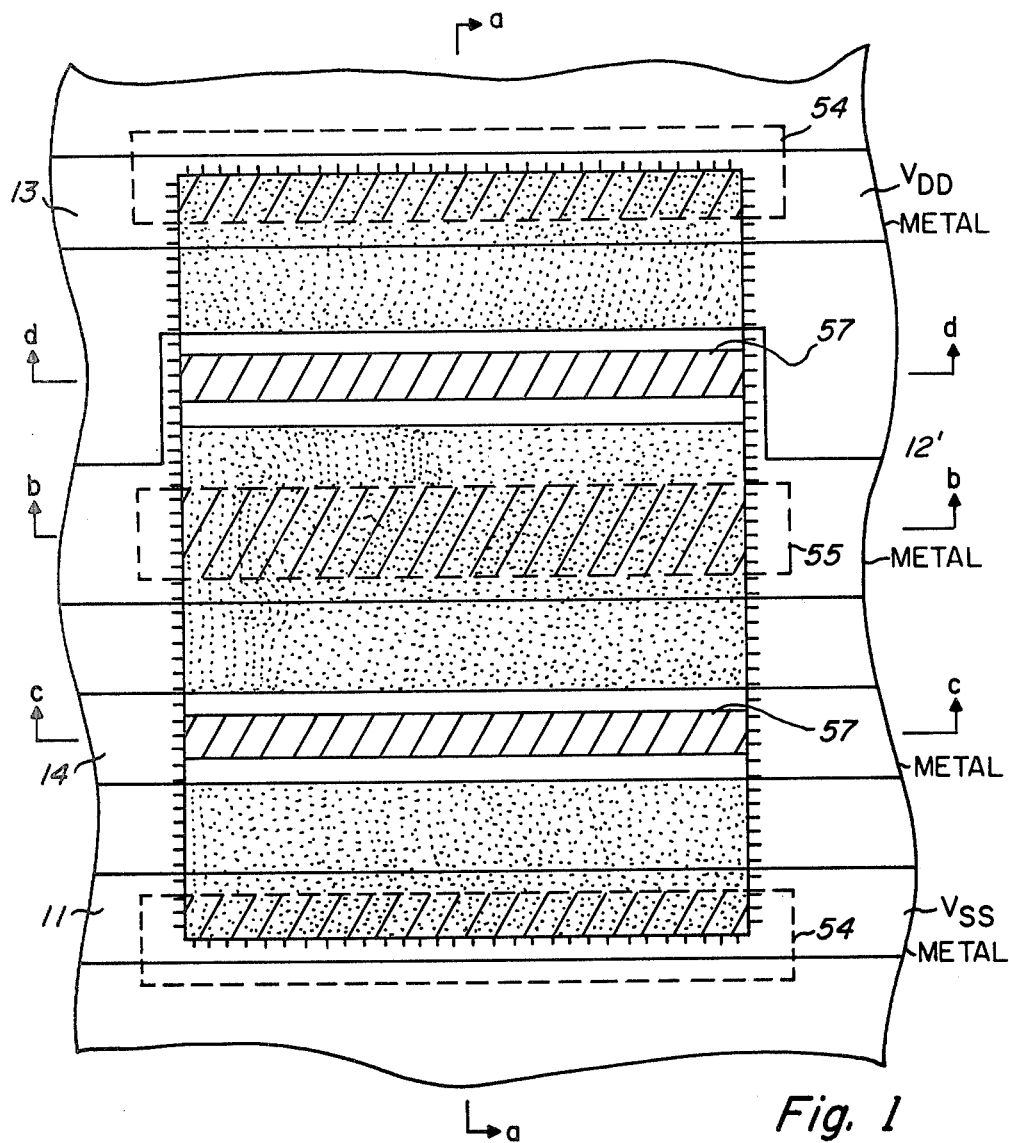
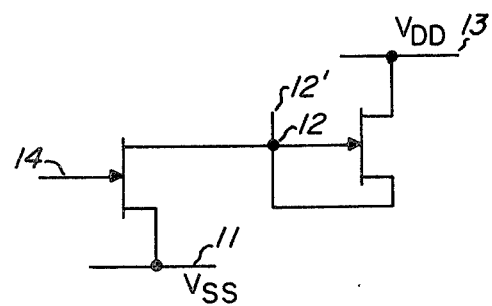
Fig. 1
Fig. 2

4,201,997

MESFET SEMICONDUCTOR DEVICE AND METHOD OF MAKING

BACKGROUND OF THE INVENTION

This invention is directed to microelectronic semiconductor devices and methods of making such devices, and more particularly, to a MESFET device and a process for making said MESFET device.

The history of integrated semiconductor circuit design has been characterized by a trend toward increasing circuit densities. Various technologies have been invented to stimulate this trend. For example, transistor-transistor logic, TTL, was standard in digital equipment for a long time but has given way in many areas to N-channel MOS logic circuits because of their superiority in speed power product, packing density and ease of device fabrication. For these reasons devices fabricated using these technologies are finding application primarily in memory and microprocessor circuits. The MESFET is another device that offers many of the advantages of the N-channel MOS technology without some of its disadvantages. It's primary application will also be in digital technology such as memory and microprocessor type circuits.

One of the problems with N-channel MOS devices is that when they are scaled down in size the gate oxide thickness must be scaled down accordingly. This creates a problem because it is very difficult to fabricate thin silicon oxides that are free from pinholes. If there is a pinhole in one of the gate oxides there will be a gate to channel short and consequently a device failure. Since there are thousands of gate oxide areas on a typical N-channel MOS memory of microprocessor this problem can be very serious.

In copending application, Ser. No. 6842 filed herewith by Darley et al, a MESFET device is disclosed which solves many of the problems with the N-channel MOS silicon gate integrated circuits. With the continuing trend toward higher packing densities the MESFET device described in the above mentioned copending application is not going to be satisfactory for future design needs. There are too many alignment tolerances which restrict chip size that must be allowed for in the device design. These tolerances also limit device performance by increasing the source to drain series resistance.

It is a principal object of this invention to provide an improved MESFET device which is useful in the design of high density digital logic circuits and a method for making said device. Another object is to provide an improved MESFET device with high packing density and low source to drain series resistance.

SUMMARY OF THE INVENTION

In accordance with the present invention a self-aligned gate MESFET device that has implanted channel stoppers under field oxide, depletion and enhancement mode device channel implants, implanted source and drain regions, selective oxidation to form a self-aligned metal-semiconductor gate, and a composite thin film of metal for the interconnects. In making the device, a thin silicon oxide layer is grown and a silicon nitride layer deposited upon it. The areas for the channel stoppers are defined and implanted, and then a thick field oxide is grown consuming the silicon as it grows. The thin oxide and nitride are removed and a channel implant takes place. After the first channel implant, enhancement mode device channel areas are covered with a resist pattern and the slice receives another implant, effective only in the depletion mode device channel areas. An oxide-nitride-oxide layer is deposited and patterned, and the slice is implanted to form source and drain areas. The nitride edges are etched to define the self-aligned gates and the slice oxidized to form a thinner "field" oxide which surrounds the self-aligned gates. The contact areas are defined in the thinner "field" oxide followed by removal of the nitride and oxide over the self-aligned gates. Platinum silicide regions are created by platinum deposition and sinter. The deposition and definition of a metal system completes the process.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a greatly enlarged plan view of a small portion of a semiconductor chip showing the physical layout of an inverter fabricated using the invented process;

FIG. 2 is an electrical schematic diagram of the inverter of FIG. 1;

DETAILED DESCRIPTION OF SPECIFIC EMBODIMENT

Figure 3A:
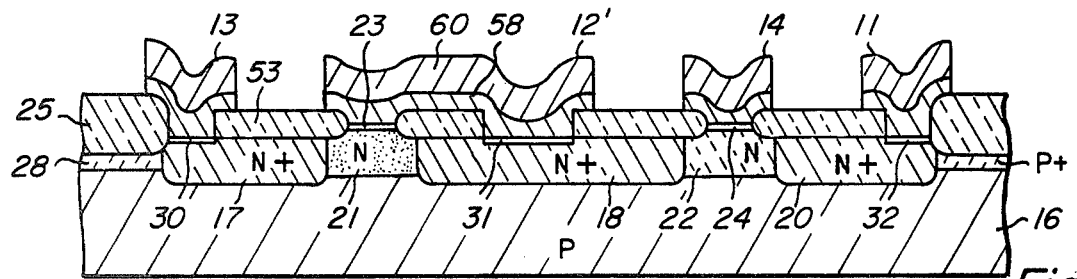
FIGS. 3a–3d are elevation views in section of the inverter of FIG. 1, taken along the lines a—a.
Figure 3B:
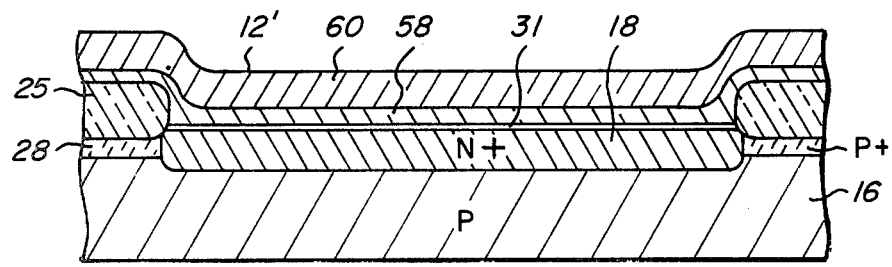
Figure 3C:
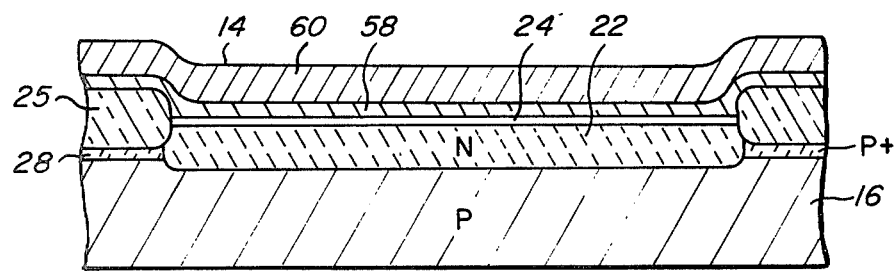
Figure 3D:
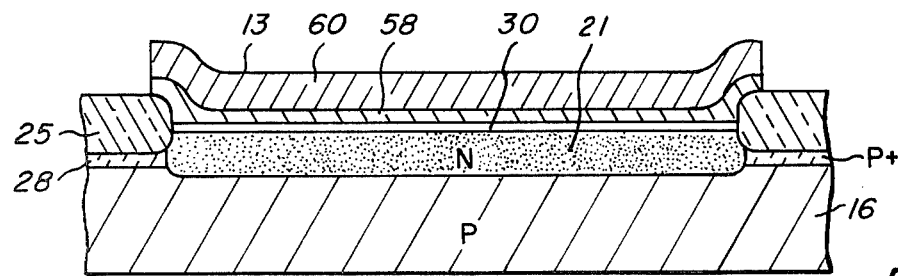

Referring to FIG. 1, a physical layout of a MESFET inverter 10 is shown which is fabricated using the process which is the subject of the invention. The inverter is greatly enlarged over actual size. The inverter is also shown in FIG. 2 drawn as an electrical schematic diagram, with the parts numbered and laid out the same.

The inverter of FIGS. 1 and 2 having an input 14 and an output 12' consists of two MESFET transistors $Q_1$ and $Q_2$, $Q_1$ having its source connected to Vss or ground line 11. $Q_1$ operates as a driver transistor having its drain connected to a node 12 of the source of $Q_2$. $Q_2$, operating as a depletion mode load device, has its drain connected to Vdd or a positive supply line 13 and its gate and source connected to a node 12 at the drain of $Q_1$.

The circuit of the inverter in FIG. 2 is the same as that used in conventional MOS or JFET integrated circuits. The MESFET closely resembles a JFET except that the PN gate junction of the JFET is replaced by a metal-semiconductor junction. This metal-semiconductor junction significantly reduces minority carrier injection and allows the MESFET to turn off more quickly than a JFET.

Section views of the inverter of FIG. 1 showing the details of construction are shown in FIGS. 3a–3d. It should be kept in mind when examining the section views that not all geometries, junction depths, and layer thicknesses are necessarily to scale, some having been enlarged or reduced where necessary to reflect features of the invention. The inverter 10 is a small part of the substrate 16 of P-type silicon. The transistors $Q_1$ and $Q_2$ are formed by N+ diffused regions 17, 18, and 20 which create the source and drain regions. The channels 21 and 22 of the transistors are implanted to vary the threshold voltages of the transistors. Platinum silicide regions 23 and 24 form metal-semiconductor junctions which are the gates of the MESFETs. Platinum silicide regions 30, 31 and 32 form contacts to the source and drain regions. Thick field oxide 25 exists at all areas where N+ regions or transistors do not exist, and a P+ boron-doped channel-stop region 28 is created under all areas of the thick field oxide. Thinner "field" oxide 53 covers the source and drain areas and is adjacent to the self-aligned gates. The lines 11, 12', 13, and 14 are metal strips making contact to the platinum silicide areas.

Figure 4A:
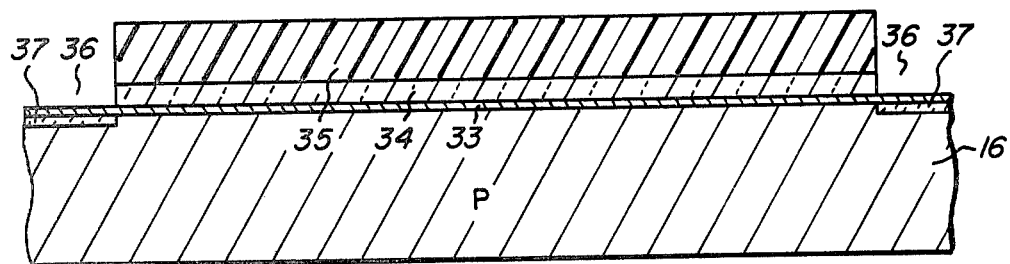
FIGS. 4a–4l are elevation views in section of the semiconductor device of FIGS. 1 and 3a–3d, at successive stages in the manufacturing process.

Referring now to FIGS. 4a–4l, a process for making the MESFET integrated circuit device of FIGS. 1 and 3a–3d will be described. The starting material is a slice of P-type monocrystalline silicon, perhaps 2 inches in diameter and 16 mils thick, cut on the <100> plane, of a resistivity of about 30 to 50 ohm-cm. In FIGS. 3a or 4a, a wafer or body 16 represents a very small part of the slice, chosen as a representative sample cross section. First, after appropriate cleaning, the slice is oxidized by exposing to oxygen in a furnace at an elevated temperature of perhaps 900 degrees C. to produce an oxide layer 33 of a thickness of about 500 Angstroms. Next, a layer 34 of silicon nitride is formed by exposing the slice to an atmosphere of silane and ammonia in a furnace tube of perhaps 900 degrees C. This layer 34 is grown to a thickness of about 1500 Angstroms. A coating 35 of photoresist is applied to the entire top surface, then exposed to ultraviolet light through a mask which defines the desired pattern, and developed. This leaves areas 36 where nitride is to be etched away. The slice is subjected to a nitride etchant, which removes the exposed part of the nitride layer 34 but does not remove the oxide layer 33 and does not react with the photoresist 35.

The slice is now subjected to an ion implant step, whereby boron atoms are implanted in the areas of silicon not covered by photoresist 35 and nitride 34. The photoresist could have been removed, but preferably is left in place as it masks the implant. Boron is an impurity which produces P-type conductivity, so a more heavily doped P+ region 37 will be produced in the surface. The oxide layer 33 is left in place during the implant because it prevents the implanted boron atoms from out-diffusing from the surface during subsequent heat treatment. The boron implant is at a dosage of about $8 \times 10^{12}/cm^2$ at 40 KeV.

As will be seen, the region 37 does not exist in the same form in the finished device, because some of this part of the slice will have been consumed in the oxidation procedure.

Figure 4B:
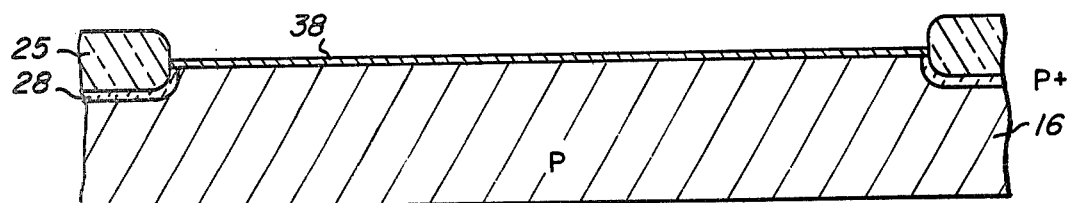

The photoresist 35 is removed and the following step in the process is formation of field oxide, which is done by subjecting the slices to steam or an oxidizing atmosphere at about 950 degrees C. for perhaps 4 hours. This causes a thick field oxide region or layer to be grown, and this region extends into the silicon surface because silicon is consumed as it oxidizes. The nitride layer 34 masks oxidation beneath it. The thickness of this layer 25 is about 7500 to 8500 Angstroms, half of which is above the original surface and half below. The boron doped P+ region 37 formed by implant will be partly consumed, but will also diffuse further into the silicon ahead of the oxidation front. Thus, a P+ region 28 will result which will be a channel stopper to prevent parasitic effects between devices in separate isolated areas. FIG. 4b reflects a cross-section of the slice at this point in the fabrication process.

Figure 4C:
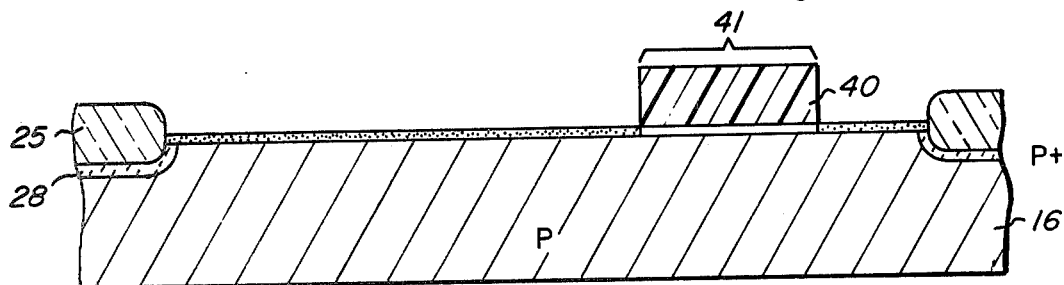

The next step in the process is the creation of the N-channel regions 21 and 22. The silicon nitride layer 34 and the silicon oxide layer 33 are removed while leaving the field oxide 25 basically intact. The slice is exposed to an arsenic implant where arsenic atoms are implanted in all areas of the silicon slice that are not covered by implant blocking field oxide 25. Arsenic is an impurity which produces N-type conductivity in silicon. An implanted region 38 is produced by implanting a dose of about $1.0 \times 10^{12}/cm^{12}$ at 180 KeV. Note that although the arsenic is implanted in silicon areas which will form the MESFET transistor sources and drains, its effect in those areas will be negligible because of the much higher impurity concentration in the source and drain areas. FIG. 4b represents the slice at this stage of the process. Continuing with the channel region formation, a coating 40 of photoresist is applied over the entire surface and exposed to ultraviolet light through a mask which exposes only those portions 41 that cover the areas that will become the channels for the enhancement mode transistors. Upon developing unexposed photoresist is removed from the slice leaving only the exposed regions 41 as seen in FIG. 4c. The slice is then subjected to an implant which penetrates the slice in all areas except those regions 41 where photoresist exists. This implant is arsenic at a dose of about $1.3 \times 10^{12}$ at 180 KeV and for reasons discussed above the implant is effective only in areas which become the channels 21 of the depletion mode load transistors.

Figure 4D:
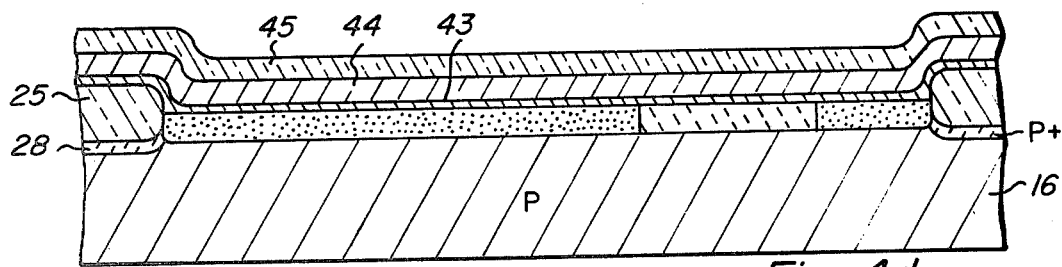

Creation of the source and drain regions is next in the fabrication process. After removal of the photoresist from the previous step, a layer 43 of silicon oxide is formed by exposing the slice to an atmosphere of silane and oxygen in an rf plasma reactor as shown in FIG. 2 of U.S. Pat. No. 3,907,616. This layer 43 is grown to a thickness of about 500 Angstroms. Next a layer 44 of silicon nitride is deposited on top of the oxide layer to a thickness of about 1500 Angstroms using the furnace tube technique previously described. This step is followed by the growth of a silicon oxide layer 45 on top of the silicon nitride using an rf plasma reactor of the same type as previously mentioned. This oxide is grown to a thickness of about 1500 Angstroms. FIG. 4d shows the slice at this point in the process. A coating 46 of photoresist is applied to the entire top surface of the slice, then exposed to ultraviolet light through a mask which defines the desired pattern, and then developed. Parts of the oxide layer 45 not covered by photoresist are removed by etching the slice in a hydrofluoric acid solution. This is followed by etch in the previously described rf plasma reactor which removes the silicon nitride 44 from areas which have been oxide etched. Next, the slice is subjected to another hydrofluoric etch to remove parts of the oxide layer 43 in areas where silicon nitride has been removed. This leaves windows 47 and 48 where the drain areas will be implanted.

Figure 4E:
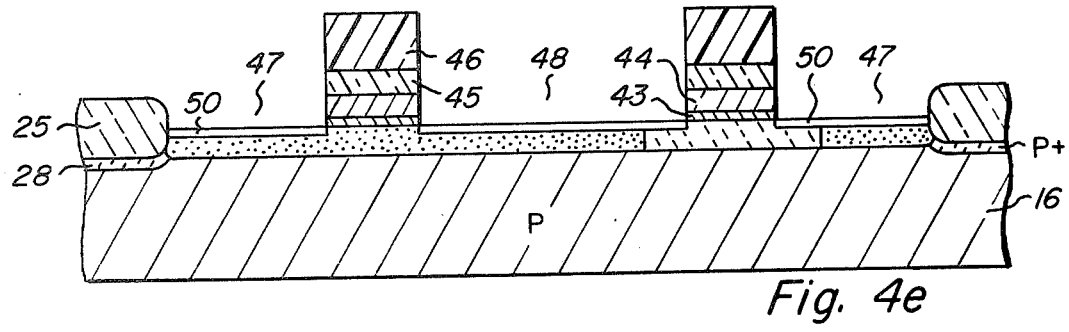
Figure 4F:
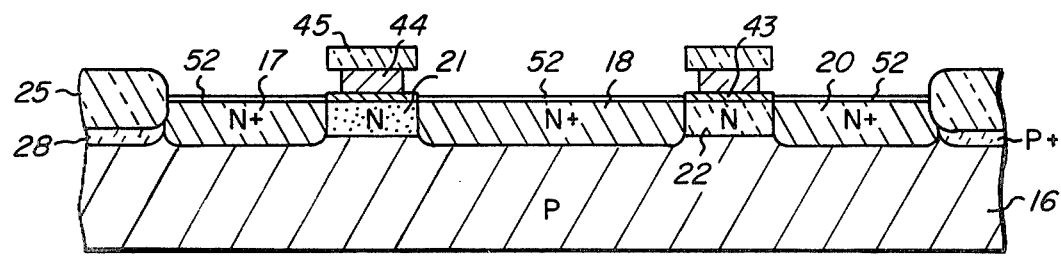
Figure 4G:
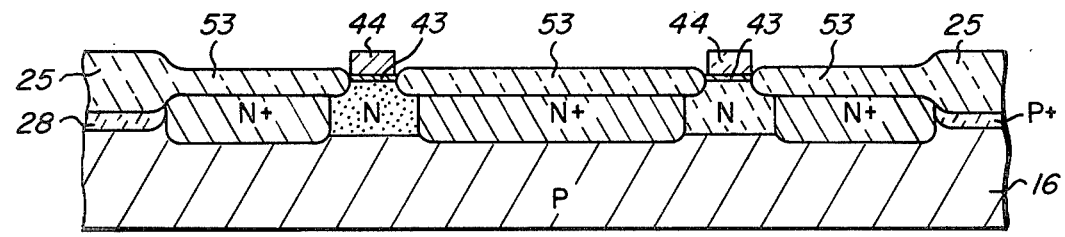
Figure 4H:
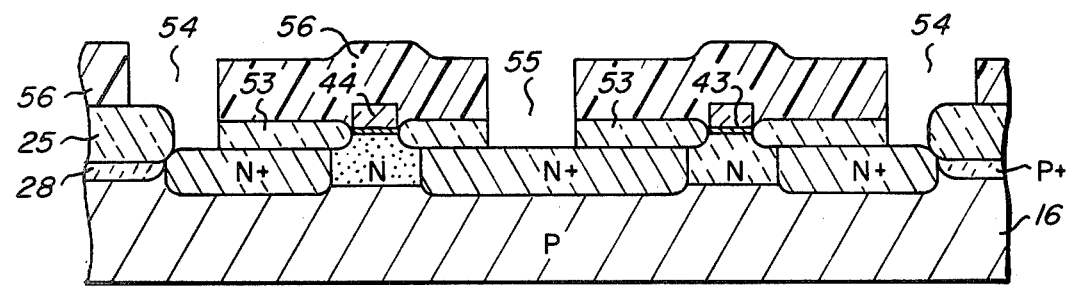
Figure 4I:
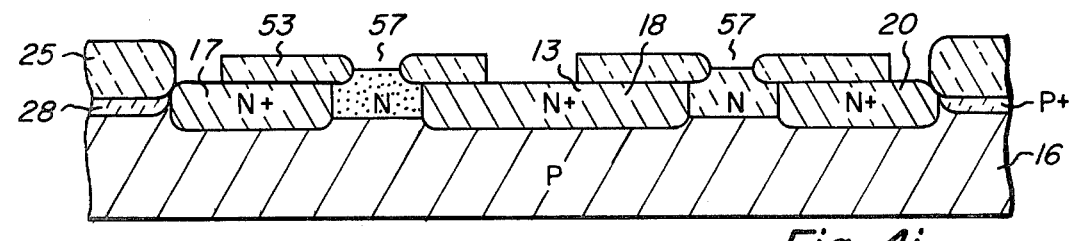

One of the features of the invention is the use of the thick field oxide 25 to define three sides of the source and drain windows 47 and two sides of the common source/drain window 48. As seen in FIG. 4e photoresist defines the other edges of these source and drain windows. This technique gives source and drain diffusion boundaries that are coincident with some edges of the field oxide 25 permitting at a subsequent step the corresponding boundaries of the source and drain contacts to be made coincident with the edges of the field oxide 25. This eliminates the need for a contact to diffusion edge space allowance and consequently increases chip packing density.

The slice is now subjected to an ion implant step where arsenic atoms are implanted in the areas of the silicon not covered by photoresist 46, oxide 45, nitride 44 and oxide 43. Implanted regions 50 are produced by implanting at a dose of about $5.0 \times 10^{15}/cm^2$ at 100 KeV. Although thick field oxide regions 25 are not covered with photoresist 46, no arsenic atoms are able to penetrate them and reach the channel stoppers 28 underneath. Therefore the implanted regions 50 and 51 which will become a drain 17 and a source 20 (see FIGS. 3a and 4l) are defined by thick field oxide 25 and photoresist. After implant the photoresist is removed and the slice is then annealed in an oxidizing ambient and in an inert ambient, preferably nitrogen, at about 1025 degrees C. for perhaps one hour to diffuse the implanted regions 50 and 51 into the slice and form source/drain regions 17, 18 and 20. A very thin oxide layer 52 is formed during this high temperature heat treatment.

The next step is a very important part of the self-aligned gate process and is a key feature of the invention. The slice is placed in phosphoric acid which etches the edges of the remaining parts of the silicon nitride layer 44. About 0.01–0.02 mils is removed from each side of the nitride islands 44 leaving a structure shown in FIG. 4f. The amount of the etch is very important because it determines the gate length and affects the series resistance of the MESFET transistor. This etch back technique allows the gate to be spaced extremely close to the source and drain areas thereby minimizing the series resistance and improving device performance. Next the thinner oxide layers 52 are removed by placing the slice in an oxide etch. An oxide layer 53 is now grown over the source/drain regions 17, 18 and 20 and small portions of the channel regions 21 and 22 by subjecting the slices to steam or an oxidizing atmosphere at about 900 degrees C. for perhaps one hour. This oxide region of about 2500 Angstroms extends into the silicon surface because silicon is consumed as it oxidizes. No oxide is grown over what is to become the gate regions 23 and 24 because the nitride layer masks oxidation beneath it. This oxidation is another of the key steps in the invention because, by referring to FIG. 4g, it can be seen that the future gate areas 23 and 24 are equally spaced between the edges of the source and drain areas 17, 18 and 20.

Figure 4J:
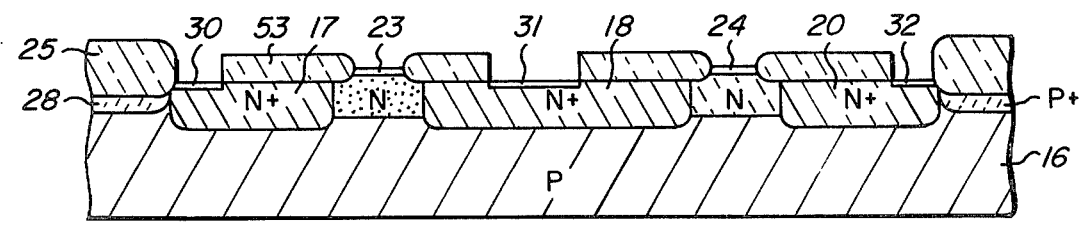
Figure 4K:
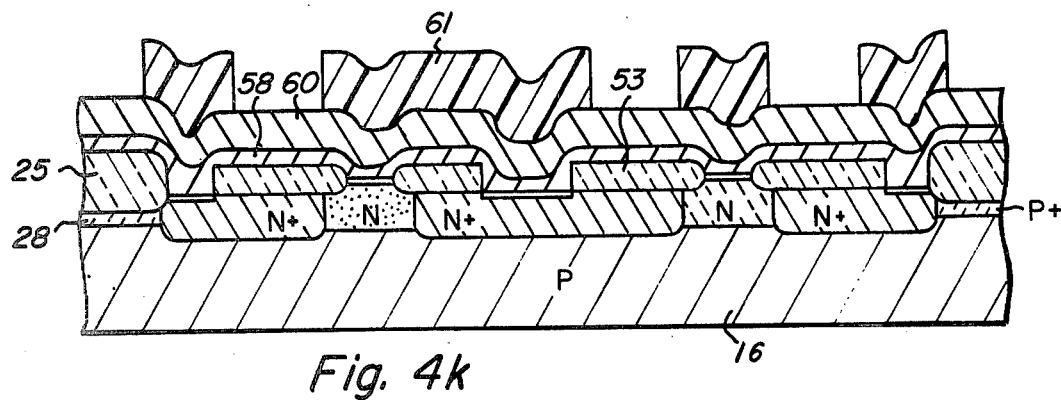

The next stage of the process is the formation of the MESFET source and drain contact windows 54 and 55. A photoresist coating 56 is applied over the entire slice and exposed to ultraviolet light through a mask which exposes everything except those areas which are to become contacts of the MESFET transistors. Upon developing, unexposed photoresist is removed from the areas where the contacts will be created. The oxide layer 53 which is not covered by photoresist 56 is removed by etching the slice in hydrofluoric acid resulting in the structure of FIG. 4h. This figure along with FIG. 4j shows another of the features of the invention, the use of the thick field oxide 25 to define three edges of the source and drain contacts 30 and 32 and contact windows 54 and two edges of the common source.drain contact 31 and contact window 55. The other edges of these contacts and windows are defined by the photoresist 56. Defining the contacts in this manner permits the contacts to be placed almost coincident with the corresponding edges of the sources and drains. This eliminates the need for a contact to diffusion edge space allowance and consequently increases chip packing density.

The next stage in the process is the formation of the gate windows 57. The photoresist remaining from the previous step is removed and the slice is placed in phosphoric acid to remove the silicon nitride islands 44. Next the slice is placed in hydroflouric acid for a period of time only long enough to etch away the oxide layer 43 that was beneath the nitride islands. By now examining FIG. 4i it can be seen how the key feature of the invention, the self-aligning of the gates, has been achieved. By removing the oxide layer 43 underneath the nitride islands, areas 57 are created that will become the gates 23 and 24 of the MESFET transistors. These areas are equally spaced between the edges of the sources and the drains. The advantages of this are quite clear. This self-aligning allows for smaller devices because no alignment tolerances from gate to source and drain have to be considered, and allows for better device performance by shortening the spacing from gate to source and drain and thereby reducing series resistance.

Referring to FIG. 4j it can be seen that contacts 30, 31 and 32 are formed in the source and drain regions, and gates 23 and 24 are formed in the channel regions. This is done by first placing the slice in a metal sputtering system where a metal such as platinum is sputtered on the slice to a thickness of about 400 Angstroms. Upon removal from the sputtering system the slice is placed in a furnace tube at about 500 degrees C. for perhaps 10 minutes. This heat treatment causes the platinum to react with the silicon to form platinum silicide gates 23 and 24 and contacts 30, 31 and 32 of about 800 Angstroms thickness. Next the platinum which did not react with the silicon is removed by placing the slice in aqua regia for about 15 minutes.

Where there is a platinum silicide-silicon boundary and the silicon is lightly doped N-type this structure will become a P-N junction where the P-region is platinum-silicide and the N-region is the silicon. Where the N-region is very heavily doped the boundary will not become a P-N junction but will be only an ohmic region. This is the difference between the gate 23 and 24 and contact 30, 31 and 32 regions. Although the platinum regions 23 and 24 are being used as gates of MESFETs, on other parts of the chip platinum silicide regions may be formed in N-regions to form discrete diodes.

Figure 4L:
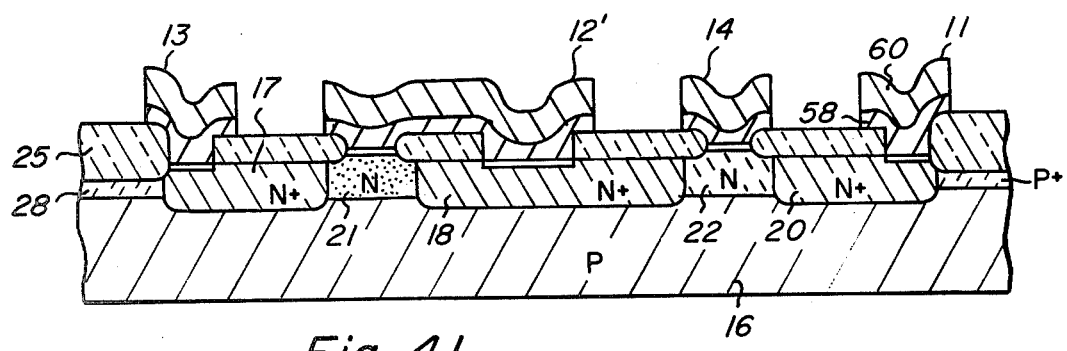

As seen in FIG. 4l the fabrication of the device is completed by connecting the metal leads to the device. The first step here involves the deposition of a titanium-tungsten (Ti-W) layer 58 on the slice by use of a metal evaporator. The purpose of the Ti-W layer is to prevent the subsequent metal layer from spiking through the platinum silicide. The Ti-W is deposited to a thickness of about 2000 Angstroms. Next another layer 60 of metallization such as gold is deposited on the slice, using the same or a different evaporator, to a thickness of about 5000 Angstroms. After the evaporation procedures a photoresist coating 61 is applied over the entire slice, then exposed to ultraviolet light through a mask that exposes the areas that are to become the metal leads 11, 12', 13 and 14. Upon developing, the unexposed photoresist is removed leaving photoresist where leads are to be formed. At this stage of the process the slice cross-section appears as in FIG. 4k. The slice is then subjected to a gold etch that removes the gold layer 60 that is not covered by photoresist 61 but does not remove the Ti-W and does not attack the photoresist. The photoresist is removed and the slice placed in hydrogen peroxide which etches the Ti-W that is not protected with gold. The slice is annealed in forming gas at about 400 degrees C. for perhaps 15 minutes which completes the process.

The operation of the MESFET is similar to that of a JFET, both devices having source, drain and gate regions. The major difference is the replacement of the semiconductor P-N junction gate on the JFET with the metal-semiconductor junction. The metal-semiconductor junctions on the MESFETs are at the junctions of the platinum silicide regions 23 and 24 and the channel regions 21 and 22 as seen in FIGS. 3a and 4l. To operate an N-channel enhancement mode MESFET such as $Q_1$ the drain 18 is biased positive with respect to the source 20. Relatively little current will flow from drain to source with the gate 24 open since the depletion region of the junction formed by the platinum silicide region 24 and the channel 22 reaches all the way across the channel 22. As the gate 24 is biased positive with respect the source 20 current begins to flow from drain to source because the depletion region no longer reaches completely across the channel. There is also some current flowing into the gate 24. The voltage from gate 24 to source 20 is clamped to approximately 0.45 volts by the platinum silicide-silicon diode. When the gate to source voltage is brought to zero volts current ceases to flow from drain to source because the depletion region again reaches across the channel. Since the depletion region width is inversely proportional to the impurity concentration in the channel 22, the threshold voltage of the MESFET can be varied by changing the impurity in the channel 22.

With an N-channel depletion mode MESFET such as $Q_2$, with the gate 23 open current would flow from drain 17 to source 18 as soon as the drain is biased positive with respect to the source. In this type device the channel 21 is doped heavier than the channel 22 of the enhancement mode device $Q_1$. Consequently, the depletion region of the platinum silicide-silicon junction does not reach all the way across the channel 21 and current may flow from drain 17 to source 18. To prevent current flow in this device the gate 23 must be biased negative to the source 18. This is not possible of course in our arrangement as seen in FIGS. 2, 3a and 4l because the gate 23 is connected to the source. This connection is made to use $Q_2$ as a load device. However on other parts of the chip, depletion mode MESFETs that operation as transistors can exist and do not have their gates connected to their sources.

What is claimed is:

1. A semiconductor device comprising:
   a semiconductor substrate of a first conductivity type;
   first, second, and third current carrying electrodes of the opposite conductivity type in surface adjacent regions of said substrate;
   a first high resistivity region of said opposite conductivity type in a surface adjacent region of said substrate and between and contiguous with at least one perimeter portion of said first and second current carrying electrodes;
   a second high resistivity region of said opposite conductivity type in a surface adjacent region of said substrate and between and contiguous with at least one perimeter portion of said second and third carrying electrodes;
   a first dielectric region in said substrate surrounding said device;
   a heavily doped region of said first conductivity type lying below and in contact with said first dielectric region;
   a second dielectric region in said substrate lying between said first dielectric region and overlying part of each of said current carrying electrodes and said high resistivity regions in the areas where said current carrying electrodes and said high resistivity regions are contiguous;
   a metal silicide region formed in each of said current carrying electrodes at least one perimeter portion of each metal silicide region lying contiguous with at least one perimeter portion of said first dielectric region;
   a metal silicide region in each of said first and second high resistivity regions, the ends of said metal silicide regions in said high resistivity regions lying contiguous with a perimeter portion of said first dielectric region, each of said metal silicide regions creating a metal-semiconductor junction as a control element.

2. A device according to claim 1 wherein said first and second dielectric regions are silicon dioxide.

3. A device according to claim 2 wherein said metal silicide regions are platinum silicide.

4. A device according to claim 3 wherein said second dielectric region has apertures for contacts to said metal silicide regions.

5. A device according to claim 4 further including a metallization system covering said metal silicide regions.

6. A device according to claim 5 wherein said metallization system is composed of a first layer of titanium-tungsten and a second layer of aluminum.

* * * * *